(12) United States Patent
Halberstadt et al.

(10) Patent No.: US 11,695,327 B2
(45) Date of Patent: Jul. 4, 2023

(54) POWER CONVERTER CONTROL USING CURRENT RECONSTRUCTION OF POWER FACTOR CORRECTION INDUCTOR CURRENT

(71) Applicant: NXP B.V., Eindhoven (NL)

(72) Inventors: Hans Halberstadt, Groesbeek (NL); Alfred Grakist, Malden (NL)

(73) Assignee: NXP B.V., Eindhoven (NL)

( * ) Notice: Subject to any disclaimer, the term of this patent is extended or adjusted under 35 U.S.C. 154(b) by 39 days.

(21) Appl. No.: 17/185,890

(22) Filed: Feb. 25, 2021

(65) Prior Publication Data
US 2022/0271652 A1    Aug. 25, 2022

(51) Int. Cl.
*H02M 1/42*     (2007.01)
*G01R 19/165*   (2006.01)
(Continued)

(52) U.S. Cl.
CPC .... *H02M 1/4225* (2013.01); *G01R 19/16538* (2013.01); *H03K 5/24* (2013.01);
(Continued)

(58) Field of Classification Search
CPC .... H02M 1/42; H02M 1/4208; H02M 1/4216; H02M 1/4225; H02M 1/4233;
(Continued)

(56) References Cited

U.S. PATENT DOCUMENTS

| 7,391,627 B2 | 6/2008 | Halberstadt et al. |
| 7,696,913 B2 * | 4/2010 | Melanson ........... H02M 1/4225 341/143 |

(Continued)

FOREIGN PATENT DOCUMENTS

| CN | 109217714 A | 1/2019 |
| EP | 3327915 A1 | 5/2018 |
| EP | 3327915 A8 | 5/2018 |

OTHER PUBLICATIONS

Kim, Jintae et al., "New Modulated Carrier Controlled PFC Boost Converter", IEEE Transactions on Power Electronics, Jun. 1, 2018, pp. 4772-4782, vol. 33, No. 6, IEEE, Piscataway, NJ, USA.

*Primary Examiner* — Thienvu V Tran
*Assistant Examiner* — Nusrat Quddus

(57) ABSTRACT

Embodiments of a power converter are disclosed. In an embodiment, the power converter comprises a power factor correction (PFC) stage circuit, an emulation circuit and a controller. The PFC stage circuit is configured to produce an output signal on an output terminal. The PFC stage circuit includes an inductor coupled between a rectifier and the output terminal and a switch coupled to the inductor. The emulation circuit is connected to the PFC stage circuit to generate an emulated current that corresponds to current through the inductor of the PFC stage circuit. The emulated current is generated based on a voltage signal at a node between the inductor and the output terminal and a sensed current at a sense resistor connected to the rectifier. The controller is connected to the emulation circuit to receive the emulated current and generate a control signal for the switch of the PFC stage circuit based on the emulated current.

16 Claims, 7 Drawing Sheets

(51) Int. Cl.
*H03K 5/24* (2006.01)
*H02M 1/00* (2006.01)

(52) U.S. Cl.
CPC ........ *H02M 1/0009* (2021.05); *H02M 1/0022* (2021.05); *H02M 1/0025* (2021.05)

(58) Field of Classification Search
CPC .. H02M 1/4241; H02M 1/425; H02M 1/4258; H02M 1/4266; H02M 2001/4275; H02M 2001/4283; H02M 2001/4291
See application file for complete search history.

(56) References Cited

U.S. PATENT DOCUMENTS

| | | | | |
|---|---|---|---|---|
| 7,719,248 | B1* | 5/2010 | Melanson | H02M 1/4225 323/283 |
| 8,120,347 | B1* | 2/2012 | Cao | H02M 1/4225 323/284 |
| 8,659,284 | B2 | 2/2014 | Halberstadt | |
| 9,564,799 | B2* | 2/2017 | Nandi | H02M 1/4225 |
| 2008/0272746 | A1* | 11/2008 | Melanson | H02M 1/4225 323/284 |
| 2008/0272748 | A1 | 11/2008 | Melason | |
| 2008/0310201 | A1* | 12/2008 | Maksimovic | H03K 7/08 363/85 |
| 2010/0097828 | A1* | 4/2010 | Chen | H02M 1/4225 363/72 |
| 2013/0141056 | A1* | 6/2013 | Yang | H02M 1/4225 323/205 |
| 2014/0052394 | A1* | 2/2014 | Sun | G01R 21/133 702/61 |
| 2015/0155776 | A1 | 6/2015 | Castelli et al. | |
| 2016/0020692 | A1* | 1/2016 | Castelli | H02M 1/4208 323/205 |
| 2016/0352216 | A1* | 12/2016 | Sonnaillon | H02M 1/4208 |
| 2017/0170745 | A1* | 6/2017 | Wu | H02M 1/143 |
| 2017/0366098 | A1* | 12/2017 | Gong | H02M 1/42 |
| 2019/0379273 | A1* | 12/2019 | Wang | H02M 1/4225 |
| 2020/0136510 | A1* | 4/2020 | Nam | H02M 3/158 |

* cited by examiner

POWER CONVERTER CONTROL USING CURRENT RECONSTRUCTION OF POWER FACTOR CORRECTION INDUCTOR CURRENT

BACKGROUND

A power factor correction (PFC) stage is a state of art circuit that is used to improve the power factor and total harmonic distortion (THD) of a power converter. Power factor correction is necessary for input powers larger than 75 Watt. A basic PFC stage circuit typically includes a rectifier bridge followed by a boost converter, which includes an inductor. The output of the PFC stage circuit is a direct current (DC) voltage with a certain ripple voltage. This output voltage may be used as a supply voltage for the next converter stage(s).

In order to control the PFC stage circuit efficiently, the current through inductor of the boost converter needs to be determined. However, there are various sensing challenges to determine the inductor current, which may include disturbances of sensed signals and limitations on the number of integrated circuit (IC) pins.

SUMMARY

Embodiments of a power converter are disclosed. In an embodiment, the power converter comprises a power factor correction (PFC) stage circuit, an emulation circuit and a controller. The PFC stage circuit is configured to produce an output signal on an output terminal. The PFC stage circuit includes an inductor coupled between a rectifier and the output terminal and a switch coupled to the inductor. The emulation circuit is connected to the PFC stage circuit to generate an emulated current that corresponds to current through the inductor of the PFC stage circuit. The emulated current is generated based on a voltage signal at a node between the inductor and the output terminal and a sensed current at a sense resistor connected to the rectifier. The controller is connected to the emulation circuit to receive the emulated current and generate a control signal for the switch of the PFC stage circuit based on the emulated current.

In an embodiment, the emulation circuit includes a voltage-to-current error amplifier to compare a first signal based on the voltage signal from the PFC stage and a second signal based on the emulated current and the sensed current.

In an embodiment, the emulation circuit further includes an integrator coupled to the voltage-to-current error amplifier to integrate an output from the voltage-to-current error amplifier to generate the emulated current.

In an embodiment, the emulation circuit further includes an error amplifier to compare the emulated current and a signal based on the sensed current and a regulator to receive an output from the error amplifier to provide the second signal to the voltage-to-current error amplifier.

In an embodiment, the emulation circuit further includes a current amplifier to amplify the sensed current from the PFC stage circuit by a factor to produce an amplified signal that is applied to the error amplifier.

In an embodiment, the emulation circuit further includes a divider to divide the voltage signal from the PFC stage circuit to produce a divided signal that is applied to the voltage-to-current error amplifier.

In an embodiment, the emulation circuit includes a feedforward compensating circuit to generate a signal related to an input signal using the voltage signal from the PFC stage circuit, the input signal being a signal at the inductor of the PFC stage circuit.

In an embodiment, the feedforward compensating circuit includes a voltage divider to divide the voltage signal from the PFC stage circuit to produce a divided signal and a resistor and a capacitor that are connected in series to produce the signal related to the input signal using the divided signal.

In an embodiment, the voltage divider of the feedforward compensating circuit is a capacitive voltage divider that includes a first capacitor and a second capacitor that are connected in series to receive the voltage signal from the PFC stage circuit and to produce the divided signal at a divide node between the first and second capacitors.

In an embodiment, the power converter further comprises a demagnetization detector that includes a comparator with a first input connected to the divide node to receive the divided signal and a second input connected to receive a reference voltage, the comparator having an output to generate a demagnetization detection signal that is used to detect an end of a secondary stroke for the PFC stage circuit.

In an embodiment, a power converter comprises a power factor correction (PFC) stage circuit, an emulation circuit and a controller. The PFC stage circuit is configured to produce an output signal on an output terminal. The PFC stage circuit includes an inductor and a diode that are connected in series between a rectifier and the output terminal. The PFC stage circuit further includes a transistor coupled between the inductor and electrical ground. The emulation circuit is connected to the PFC stage circuit to generate an emulated current that corresponds to current through the inductor of the PFC stage circuit. The emulated current is generated based on a voltage signal at a node between the inductor and the output terminal and a sensed current at a sense resistor connected to the rectifier and the electrical ground. The controller is connected to the emulation circuit to receive the emulated current and generate a control signal for the transistor of the PFC stage circuit based on the emulated current.

In an embodiment, the emulation circuit includes a voltage-to-current error amplifier to compare a first signal based on the voltage signal from the PFC stage and a second signal based on the emulated current and the sensed current.

In an embodiment, the emulation circuit further includes an integrator coupled to the voltage-to-current error amplifier to integrate an output from the voltage-to-current error amplifier to generate the emulated current.

In an embodiment, the emulation circuit further includes an error amplifier to compare the emulated current and a signal based on the sensed current and a regulator to receive an output from the error amplifier to provide the second signal to the voltage-to-current error amplifier.

In an embodiment, the emulation circuit includes a feedforward compensating circuit to generate a signal related to an input signal using the voltage signal from the PFC stage circuit, the input signal being a signal at the inductor of the PFC stage circuit.

In an embodiment, the feedforward compensating circuit includes a voltage divider to divide the voltage signal from the PFC stage circuit to produce a divided signal and a resistor and a capacitor that are connected in series to produce the signal related to the input signal using the divided signal.

In an embodiment, the voltage divider of the feedforward compensating circuit is a capacitive voltage divider that includes a first capacitor and a second capacitor that are connected in series to receive the voltage signal from the PFC stage circuit and to produce the divided signal at a divide node between the first and second capacitors.

In an embodiment, the power converter of claim further comprises a demagnetization detector that includes a comparator with a first input connected to the divide node to receive the divided signal and a second input connected to receive a reference voltage, the comparator having an output to generate a demagnetization detection signal that is used to detect an end of a secondary stroke for the PFC stage circuit.

In an embodiment, a method for operating a power converter comprises receiving a control signal at a power factor correction (PFC) stage circuit to produce an output signal on an output terminal of the PFC stage circuit, the PFC stage circuit including an inductor coupled between a rectifier and the output terminal and a switch coupled to the inductor that is controllable by the control signal, generating an emulated current that corresponds to current through the inductor of the PFC stage circuit using an emulation circuit connected to the PFC stage circuit, the emulated current being based on a voltage signal at a node between the inductor and the output terminal and a sensed current at a sense resistor connected to the rectifier, and generating the control signal for the PFC stage circuit based on the emulated current using a controller connected to the emulation circuit to receive the emulated current.

In an embodiment, the method further comprises comparing, at the emulation circuit, a first signal based on the voltage signal from the PFC stage and a second signal based on the emulated current and the sensed current to produce an intermediate signal, and integrating the intermediate signal using an integrator to produce the emulated current.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended FIGS. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
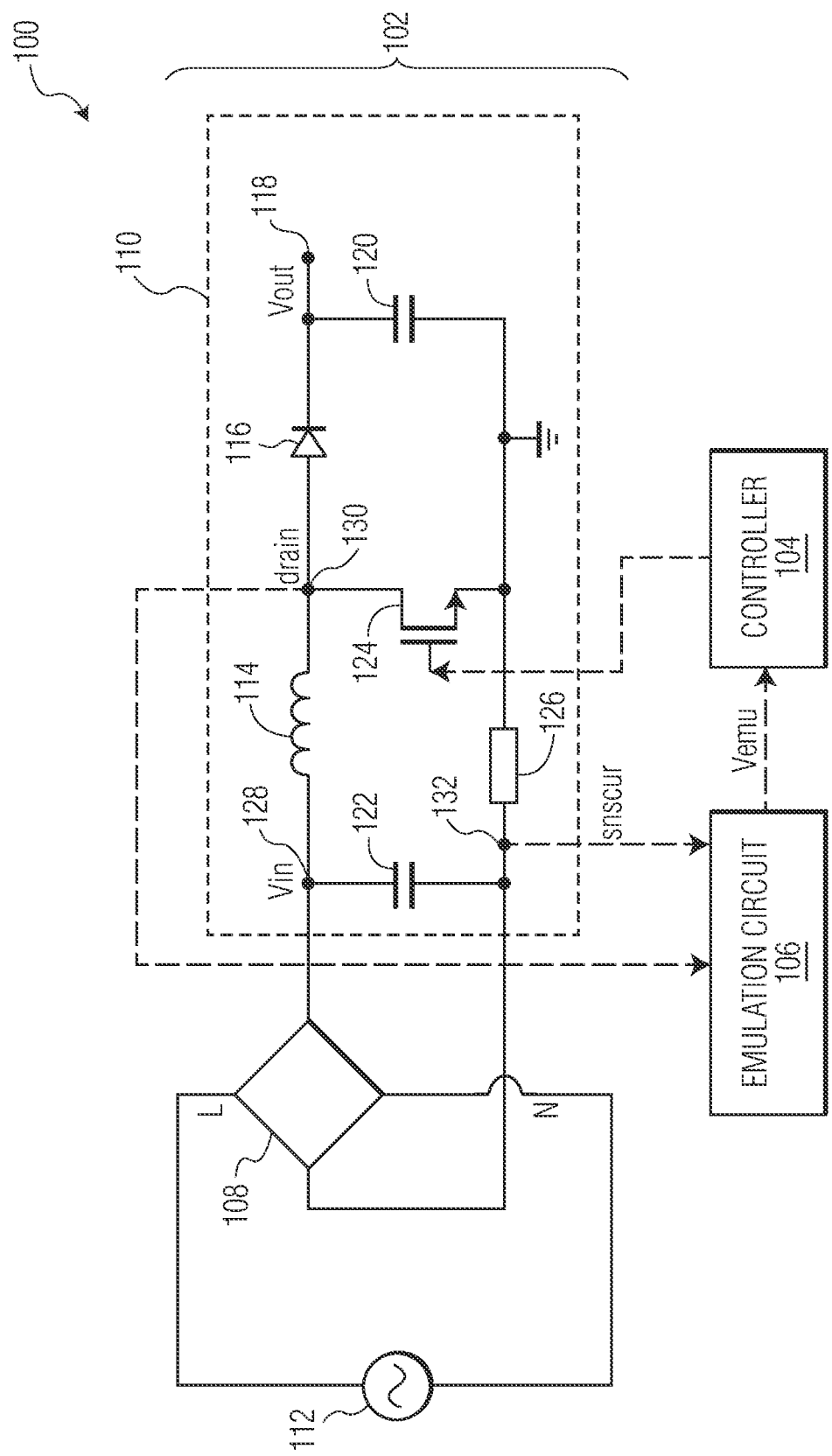
FIG. 1 is a diagram of a power converter in accordance with an embodiment of the invention.

FIG. 1 illustrates a power converter 100 in accordance with an embodiment of the invention. The power converter 100 includes a power factor correction (PFC) stage circuit 102, a controller 104 and an emulation circuit 106. The PFC stage circuit 102 operates to generate an output voltage Vout, which may be used as a supply voltage for at least one other converter stage circuit (not shown). The PFC stage circuit 102 is controlled by the controller 104 using an emulated inductor current Vemu generated by the emulation circuit. The emulation circuit operates to generate the emulated inductor current Vemu by sensing voltage and current in the PFC stage circuit, as described in detail below.

As shown in FIG. 1, the PFC stage circuit 102 includes a rectifier 108 followed by a boost converter 110. The rectifier 108 is connected to a power source 112, such as mains electricity supply. The boost converter 110 includes an inductor 114 and a diode 116 that are connected in series between the rectifier 108 and an output terminal 118, which is connected to electrical ground via a capacitor 120. The boost converter 110 further includes a capacitor 122, a switch 124 and a sense resistor 126. The capacitor 122 is connected between the outputs of the rectifier 108 to an input node 128. The switch 124 is connected to a drain node 130, which is located between the inductor 114 and the diode 116, and to electrical ground. In the illustrated embodiment, the switch 124 is a metal oxide semiconductor field effect transistor (MOSFET). However, in other embodiments, the switch 124 may be another type of a transistor. The sense resistor 126 is connected between the rectifier 108 and electrical ground. In addition, a sensed current node 132 is located between the rectifier 108 and the sense resistor 126.

In operation, the switch 124 of the PFC stage circuit 102 is controlled by the controller to produce a DC voltage on the output terminal 118 with a certain ripple voltage. This voltage is used as supply voltage for the next converter stage or stages (not shown).

Controller integrated circuits (ICs) for power converters in general have limited number of pins, because encapsulations with more pins are larger and often more expensive. Another point of attention is disturbance of sensed signals. Disturbance can be caused by many sources such as: (1) magnetic coupling between printed circuit board (PCB) tracks holding large currents, especially fast changing currents, (2) capacitive coupling between sensitive sensing inputs and switching nodes, and (3) non-ideal PCB layout because of all kinds of compromises during PCB layout, for example, the need for single layer PCB.

In addition, non-synchronized switching frequency of these converters will cause uncorrelated disturbances, especially when more power converters are present on the PCB. Such disturbances could have undesired effects on all kinds of characteristics of the power converters such as: (1) irregular switching frequencies causing audible noise, (2) low frequency interference causing increased total harmonic distortion (THD), and (3) disturbance of other basic functionality.

For a PFC stage circuit operating in continuous conduction mode (CCM) operation, additional reverse recovery effects occur because the PFC diode, e.g., the diode 116, must switch off while conducting large currents. This gives much more severe disturbances compared to discontinuous conductor mode (DCM) operation. Because in CCM, the PFC primary stroke duration is not directly related to the momentary peak current and average current over a switching cycle, while this current setting is needed to ensure the required input current is drawn from the mains, peak current control is a good solution to control a converter operating in CCM, while traditional control based on DCM mainly uses on time control.

However, because of the severe disturbances and requirements for low sensing resistance for sensing the current (power dissipation in the sense resistor must be low), sensing signals can also become heavily disturbed. In addition, the desire for only one (1) ground connection for the IC makes it more difficult to keep the internal signals clean. Filtering out the disturbance from sensed signals is only possible for high frequencies much above the switching frequency. This is because otherwise it would give too much delay in the sensing, which effects proper behavior of the system that relies on momentary current. The result is that in practice it is not possible to use sufficient filtering, making it impossible to use peak current control directly.

Reconstructing or emulating an inductor current by integrating the voltage across the inductor is a well-known solution that is applied already in many ICs and applications. However, this requires that both terminals of the inductor are available for sensing the voltage across the inductor.

Due to the limitation of the number of IC pins, it is not always possible to sense the voltage at the inductor terminal connected to the rectified mains. Therefore, it is not directly possible to apply the standard method of current emulation. However, the emulation circuit 106 of the power converter 100 is designed to generate an emulated inductor current without sensing the voltage at the inductor terminal, as explained below.

Figure 2:
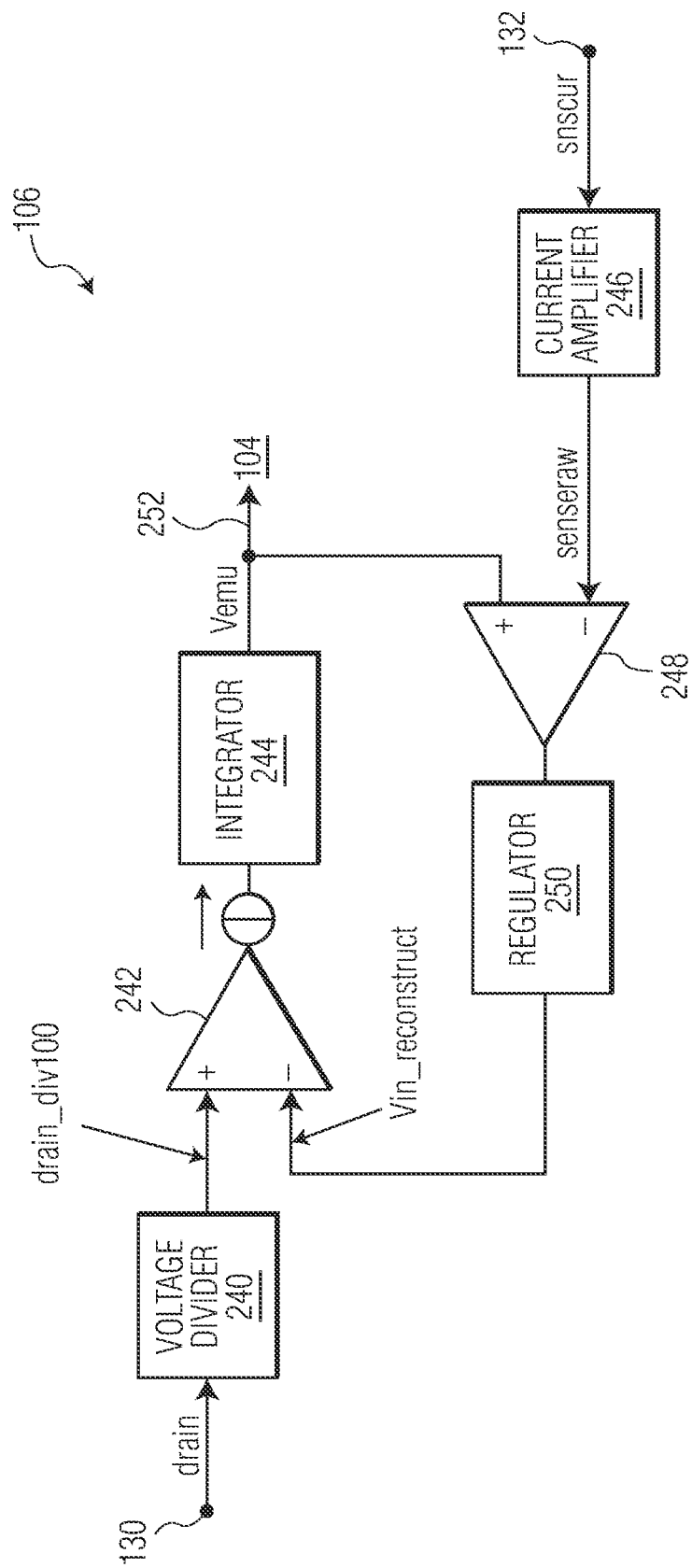
FIG. 2 shows components of an emulation circuit in the power converter depicted in FIG. 2 in accordance with an embodiment of the invention.

Turning now to FIG. 2, components of the emulation circuit 106 in accordance with an embodiment of the invention are illustrated. As shown in FIG. 2, the emulation circuit 106 includes a voltage divider 240, a voltage-to-current error amplifier 242, an integrator 244, an optional current amplifier 246, an error amplifier 248 and a regulator 250. The voltage divider 240 is connected to the drain node 130 of the PFC stage circuit 102 to receive the drain voltage of the MOSFET 124 of the PFC stage circuit. The output of the voltage divider 240 is connected to one of the inputs of the voltage-to-current error amplifier 242. The other input of the voltage-to-current error amplifier 242 is connected to the regulator 250. The output of the voltage-to-current error amplifier 242 is connected to the integrator 244. The output of the integrator 244 is connected to an output terminal 252, which provides the reconstructed inductor current Vemu. This output is used by the controller 104 to estimate the inductor current Iind using the following equation: Iind=k× Vemu, where k is a constant. The value k is set based on the similarity between Equation 1 and Equation 2, which are presented below.

The current amplifier 246 is connected to the sensed current node 132 to receive the sense current from the PFC stage circuit 102. The output of the current amplifier 246 is connected to one of the inputs of the error amplifier 248. The other input of the error amplifier 248 is connected to the output terminal 252 to receive the reconstructed inductor current Vemu. The output of the error amplifier 248 is connected to the regulator 250, whose output is connected to one of the inputs of the voltage-to-current error amplifier 242.

In operation, the drain voltage of the MOSFET 124 of the PFC stage circuit 102 is divided by the voltage divider 240 to a level that can be handled by an IC, for example, by a factor 0.01. Since only the alternating current (AC) component is required, the preferred option is to use a capacitive voltage divider to make this factor. The divided signal drain_div100 is then used for further processing.

The sensed current snscur from the sensed current node 132 of the PFC stage circuit 102 is (optionally) amplified by a factor α by the current amplifier 246 to get a signal that can be handled in an IC. In this embodiment, negative sensing is used to get the sensed current snscur. As shown in FIG. 1, the sense resistor 126 is placed in the path between electrical ground and the mains rectifier 108. In this way, both primary and secondary current of the inductor 114 flows through the sense resistor 126, making it easy to sense the low frequency and DC component of the current. However, as the signal is negative with respect to ground, it is amplified by a negative factor to make a positive signal senseraw above ground level in the IC, which is required for further processing.

The signal senseraw is then used together with the reconstructed inductor current Vemu to create an error signal by the error amplifier 248 that passes to the regulator 250. In an embodiment, the regulator 250 includes filtering that is set to meet a certain bandwidth and stability of the loop. The regulator output Vin_reconstruct is then subtracted from the divided drain voltage drain_div100 by the voltage-to-current error amplifier 242 and then integrated by the integrator 244. In an embodiment, the integrator 244 may include a transconductance amplifier driving a capacitor that does the integration. However, there are other possible options for the integrator, such as an amplifier with a capacitor in the feedback path.

The total function of the emulation circuit 106 is to reconstruct the current Iind of the inductor 114 based on the following similarity between inductor current Iind and the reconstructed inductor current Vemu:

$$Iind = \frac{1}{Lind} \cdot \int (Vin - Vdrain)dt, \text{ and} \quad \text{(Equation 1)}$$

$$Vemu = \frac{GM}{Tau} \cdot \int (Vin\_reconstruct - Vdrain \cdot k)dt, \quad \text{(Equation 2)}$$

where Lind is the inductance of the inductor 114, Vin is the voltage at the input node 128, Vdrain is the voltage at the drain node, GM is the transconductance of the amplifier 242, Tau is the time constant of the integrator 244, Vin_reconstruct is the output of the regulator 250 and Vdrain is the voltage at the drain node 130. In Equation 2, k is the divider factor of the voltage diver 240.

For proper operation, it is required that both high frequency and low frequency/DC component of the reconstructed inductor current Vemu match with the inductor current Iind. The term Vin_reconstruct is therefore the result of the regulator activity. As long as the average value of the Vemu signal is not equal to the average value of the senseraw signal, the error loop will adapt the signal $V_{in}$_reconstruct. The signal $V_{in}$_reconstruct is basically the signal that could not be measured directly because there is no IC pin available for it.

The multiplication factor provided by the current amplifier 246 can be required to get the proper amplitude that matches the combination of the inductor 114 and sense resistor 126. This can be realized, for example, by setting the transconductance of the transconductance amplifier or adapt the integrator capacitor.

In an embodiment, a feedforward term is added to the DC component based on a sensed signal related to the input voltage of the PFC stage circuit 102 or a reconstructed input voltage. The feedforward term allows for a lower bandwidth of the error loop because most of the error signal occurs from varying input voltage, including variation due to ringing in the mains filter. Thus, if a signal is used from which the shape correlates with the shape of the unknown terminal voltage of the inductor 114, this allows for a lower bandwidth of the error loop, further reducing the problem of disturbances of the sensed current.

In this embodiment, an additional signal related to Vin is added to the divided drain voltage drain_div100. Without this component, the signal Vin_reconstruct needs to adapt continuously over the rectified mains half cycle, because the momentary Vin signal being the rectified mains voltage changes continuously and needs to be adapted by the error loop. Sharp dv/dt changes occur at Vin, especially around the mains zero crossings. This gives tighter requirements on the bandwidth of the error loop and results in a temporary shift in the Vemu signal just after the mains zero crossing. This means that an offset then occurs between the inductor current and the Vemu signal, which leads to issues in the rest of the PFC system using the inductor current.

By adding a signal related to Vin, part of the Vin_reconstruct signal is adjusted by the signal related to $V_{in}$, making the error signal and temporary offset of Vemu around the zero crossing smaller, or allowing for a lower bandwidth at the same offset. A lower bandwidth can then be used to further prevent the impact of injected disturbances.

Figure 3:
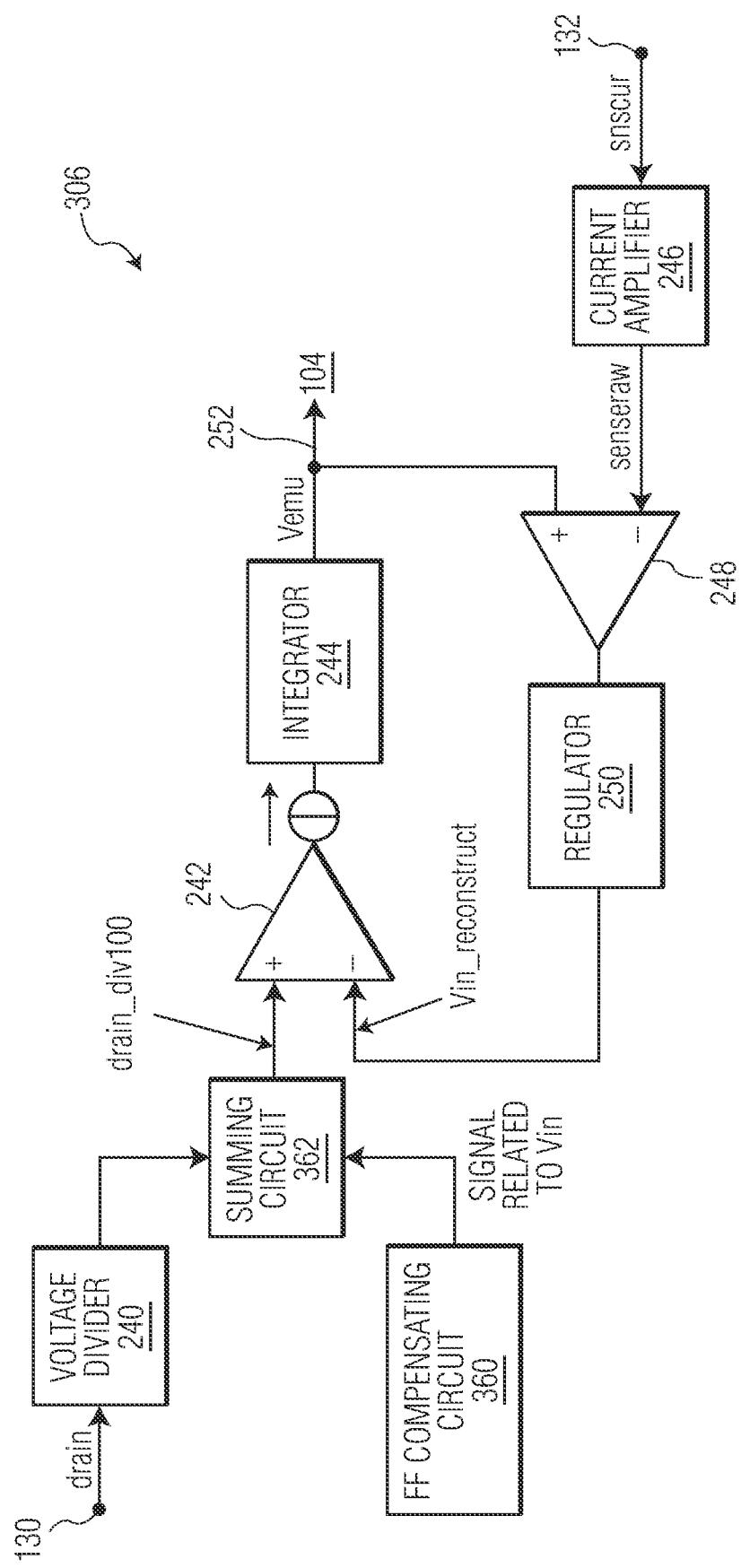
FIG. 3 illustrates an emulation circuit that uses a signal related to $V_{in}$ in accordance with another embodiment of the invention.

FIG. 3 illustrates an emulation circuit 306 that uses a signal related to $V_{in}$ in accordance with an embodiment of the invention. As shown in FIG. 3, the emulation circuit 306 includes all the components of the emulation circuit 106 depicted in FIG. 2. However, the emulation circuit 306 further includes a feedforward (FF) compensation circuit 360 and a summing circuit 362. The FF compensating circuit 360 generates the signal related to Vin, which is added to the divided drain signal from the voltage divider 240 by the summing circuit 362. In an embodiment, the summing circuit 362 may be a summing amplifier.

Figure 4:
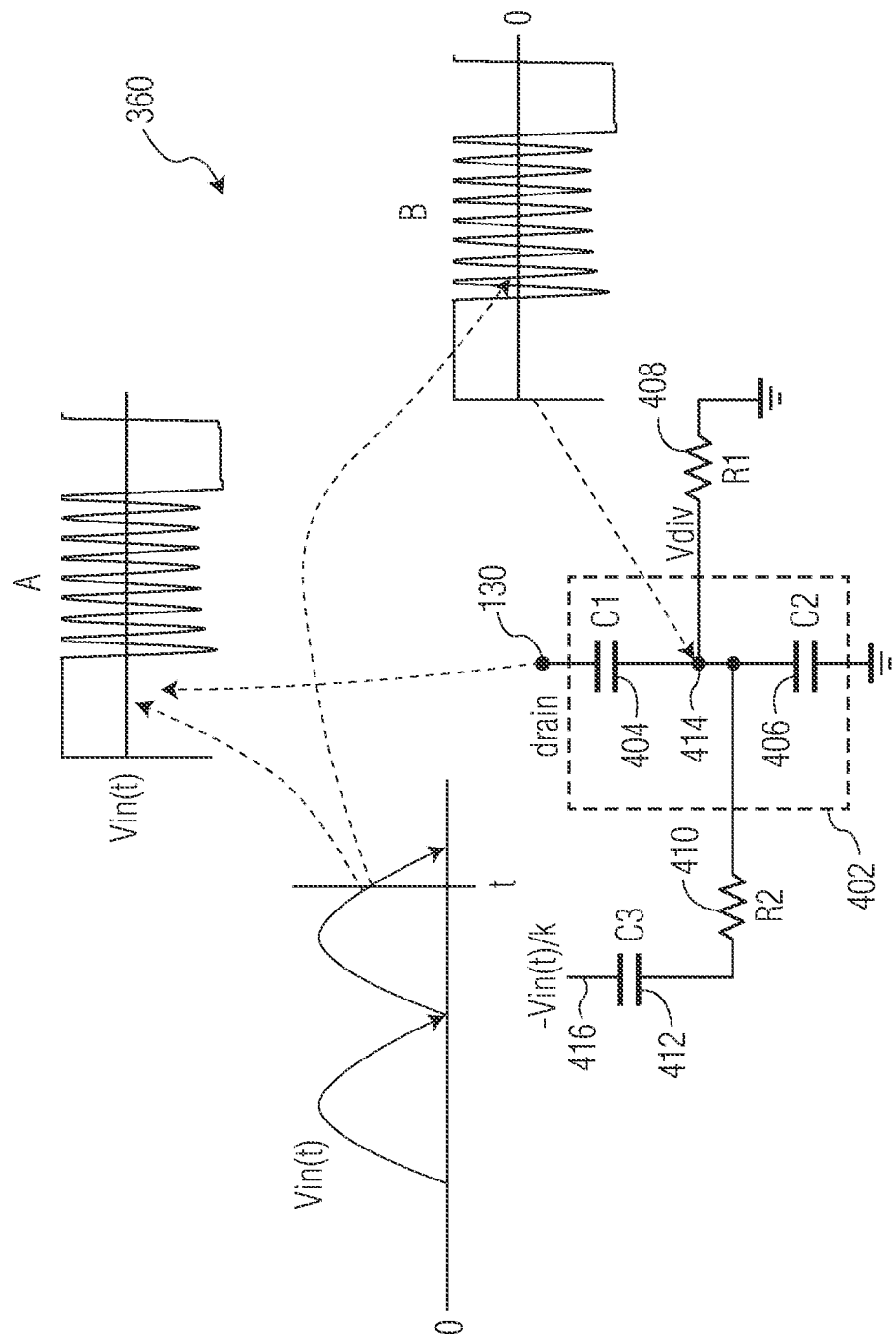
FIG. 4 shows components of a feedforward (FF) compensation circuit 360 in accordance with an embodiment of the invention are illustrated.

Turning now to FIG. 4, components of the FF compensation circuit 360 in accordance with an embodiment of the invention are illustrated. As shown in FIG. 4, the FF compensation circuit includes a capacitive divider 402 composed of a capacitor 404 with capacitance of C1 and a capacitor 406 with capacitance C2, a resistor 408 with resistance of R1, a resistor 410 with resistance of R2 and a capacitor 412 with capacitance of C3, where C3=k×C1. The capacitors 404 and 406 of the capacitive divider 402 are connected in series between the drain node 130 of the PFC stage circuit 102 and electrical ground. The resistor 408 is connected to a node 414, which is located between the capacitors 404 and 406, and to electrical ground. The resistor 410 and the capacitor 412 are connected in series between the node 414, and an output terminal 416, which is connected the summing circuit 362. The signal on the output terminal 416 is the signal related to Vin, which is −Vin(t)/k.

Figure 5:
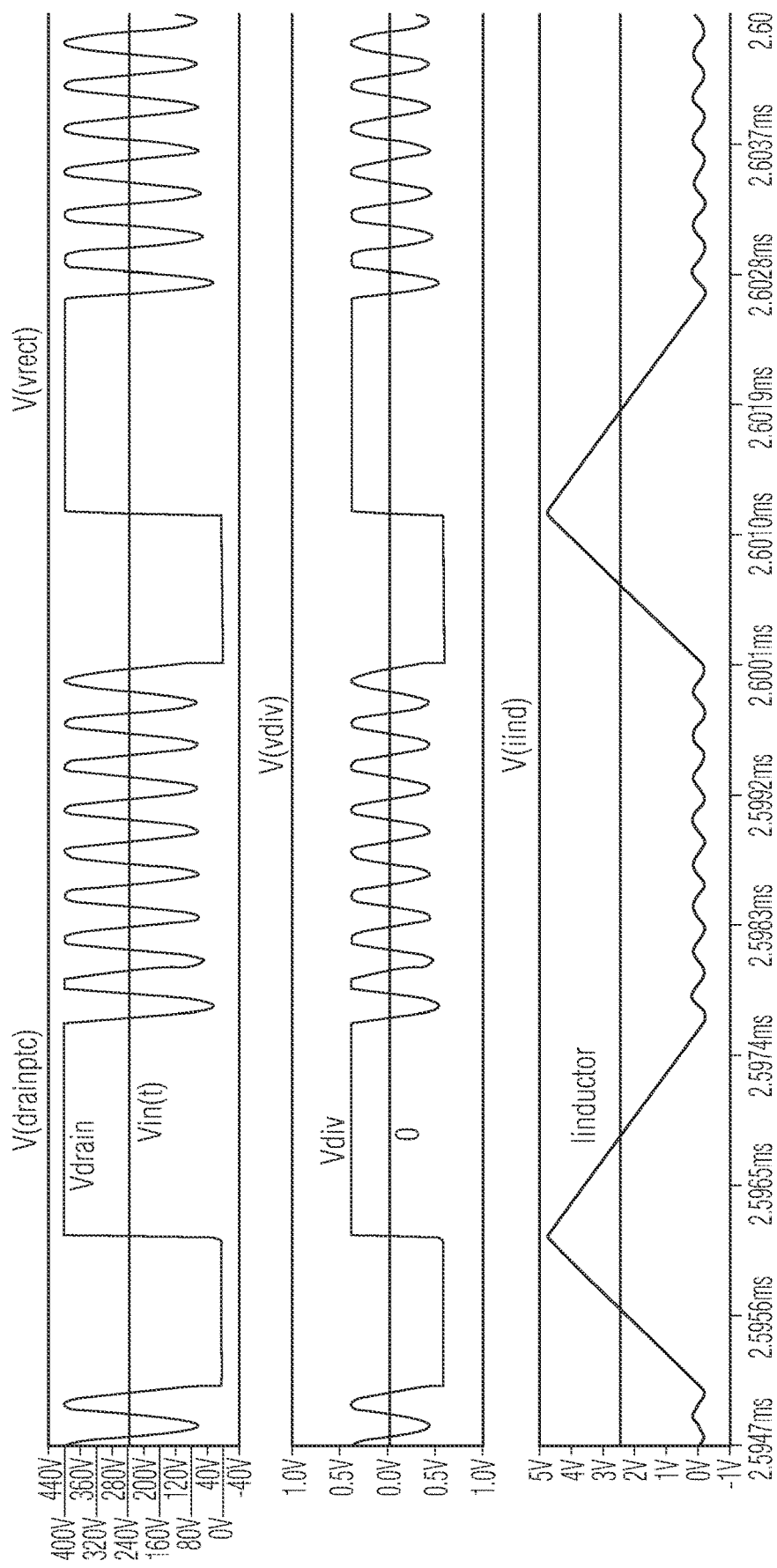
FIG. 5 shows signals before and after a capacitive divider of the FF compensation circuit depicted in FIG. 4.

Also shown in FIG. 4 are the Vin signal, the signal A at the drain node 130, and the signal B at the node 414 of the capacitive divider 402. The signals before and after the capacitive divider 402 of the FF compensation circuit 360 are shown in FIG. 5.

As a divider for scaling down the drain voltage, the capacitive divider 402 is used, which is AC coupled to ground (or a DC reference voltage) by the resistor 408. At the drain node 130, the signal A is present, which represents a switching cycle in DCM operation. The signal A includes one (1) switching cycle during an interval within a rectified mains half cycle around time t with a momentary Vin voltage equal to Vin(t). Since the inductor 114 is connected between the input node 128 and the drain node 130 and the average voltage over a switching cycle in steady state operation must be zero for an inductor, the high frequency (HF) shape will be positioned around an average value Vin(t). However, after the capacitive divider 402, this HF shape of the signal Vdiv at the node 414 will be positioned around zero and amplitude scaled down by a factor C1/(C1+C2).

When looking over a complete mains half cycle, the signal Vin(t) changes continuously. However, after the capacitive divider 402, the ideal situation is that the signal Vdiv maintains a DC component of zero. As the capacitive divider 402 also divides the changing Vin(t) shape, there is a residual component as result of Vin(t) variation being not zero. However, the integrator 244 in the emulation circuit 306 should ideally integrate a DC component of zero as this is what the inductor 114 also does. As long as this is not the case, Vemu will react by changing its DC component. Now the error loop comes in and corrects most of the DC shift.

The capacitor 412 of the FF compensation circuit 360 is added to produce a signal with a voltage shape with approximate the same shape as the Vin(t) signal but with opposite sign. What happens now when the capacitor 412 has the correct value is that the charge Q=C1×deltaV (where deltaV is Vin(t) between two (2) different moments in time within a mains half cycle) causes a DC voltage change at the Vdiv node 414. However, because the capacitor 412 is connected to a voltage with opposite sign, the same $Q=C3\times DeltaV1=C1\times k\times deltaV/k=C1\times deltaV$ is injected but with opposite sign. This means that the DC component of the Vdiv will now remain zero although Vin(t) changes. The resistor 410 of the FF compensation circuit 360 is used to prevent instability issues and to prevent that HF currents being injected from the capacitive divider 402 into the buffer amplifier (not shown) that drives the capacitor 412.

The result is that now the error signal has to correct only second order deviations of Vin so this allows to set the bandwidth of the error loop much lower with more suppression of injected disturbance into the current sensing loop.

Figure 6:
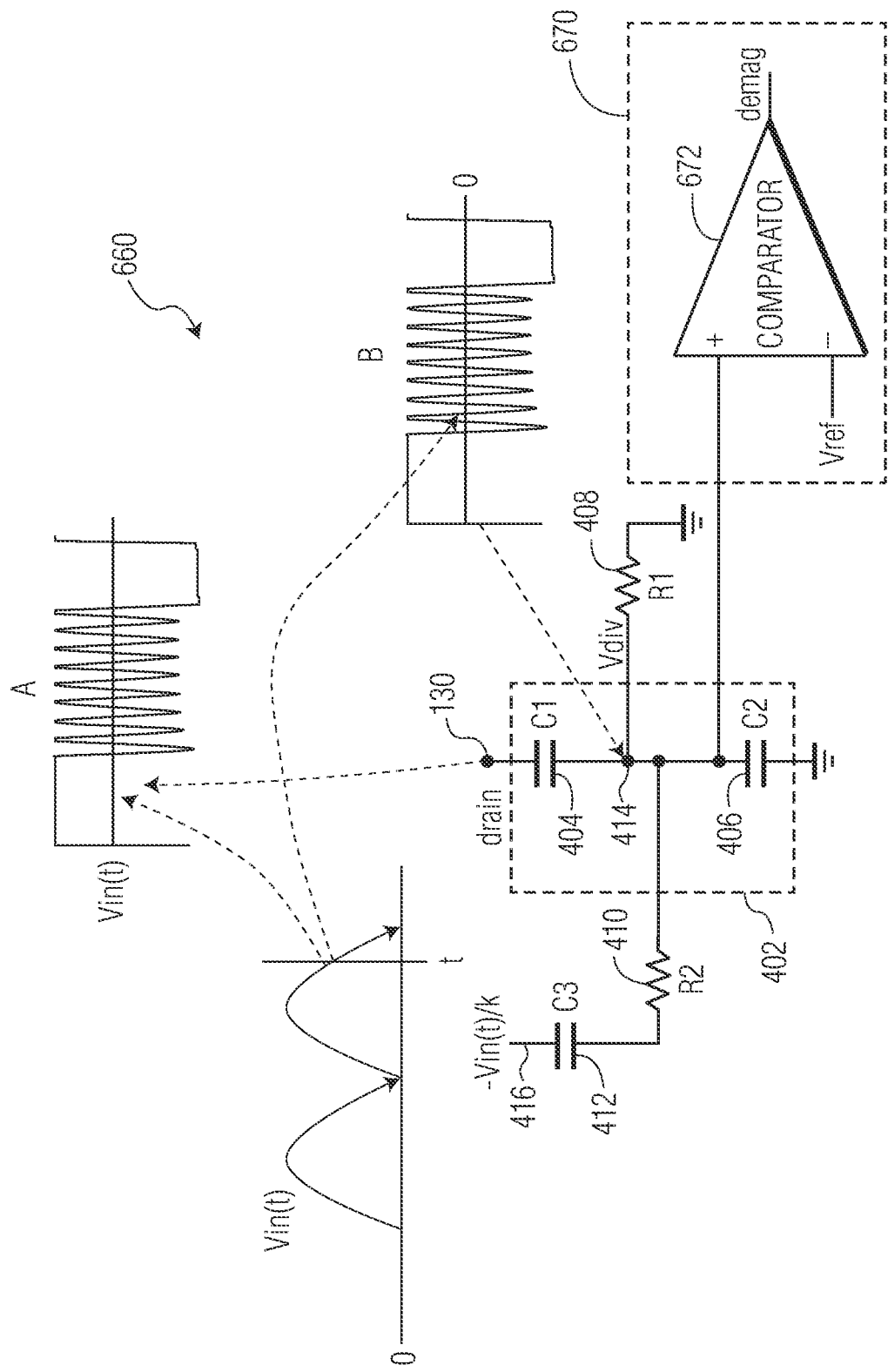
FIG. 6 shows an FF compensation circuit with a demagnetization detector in accordance with another embodiment of the invention.

In some embodiments, the FF compensation circuit 360 depicted in FIG. 4 may be modified to include a demagnetization detection feature, which uses the AC component of the sensed drain voltage as information for demagnetization detection. With this demagnetization detection, the end of the secondary stroke can be determined. FIG. 6 shows an FF compensation circuit 660 with a demagnetization detector 670 in accordance with an embodiment of the invention.

As shown in FIG. 6, the FF compensation circuit 660 includes all the components of the FF compensation circuit 360 depicted in FIG. 4 and the demagnetization detector 670. The demagnetization detector 670 includes a comparator 672 with an input connected to the node 414 between the capacitors 404 and 406 of the capacitive divider 402. The other input of the comparator 672 is connected to receive reference voltage Vref, which has a positive value close to zero. The output of the comparator 672 is a demagnetization detection signal demag.

The demagnetization detector 670 detects the end of the secondary stroke, which is defined by the inductor current becoming zero. Such demagnetization detection is needed in DCM operation to determine that the start of the next primary stroke is allowed. As shown in FIG. 5, the voltage Vdiv drops at the end of the secondary stroke when the inductor current reaches zero.

Because of the FF compensation feature of the FF compensating circuit 660, the DC component of Vdiv is close to zero and Vref can therefore be a small voltage. This is needed because at certain operating conditions of the PFC stage circuit 102, Vout and Vin come close to each other. This gives a very low positive voltage at the Vdiv node 414 during the secondary stroke, which makes this feature valuable compared to other methods for demagnetization detection when no additional IC pins are available.

Figure 7:
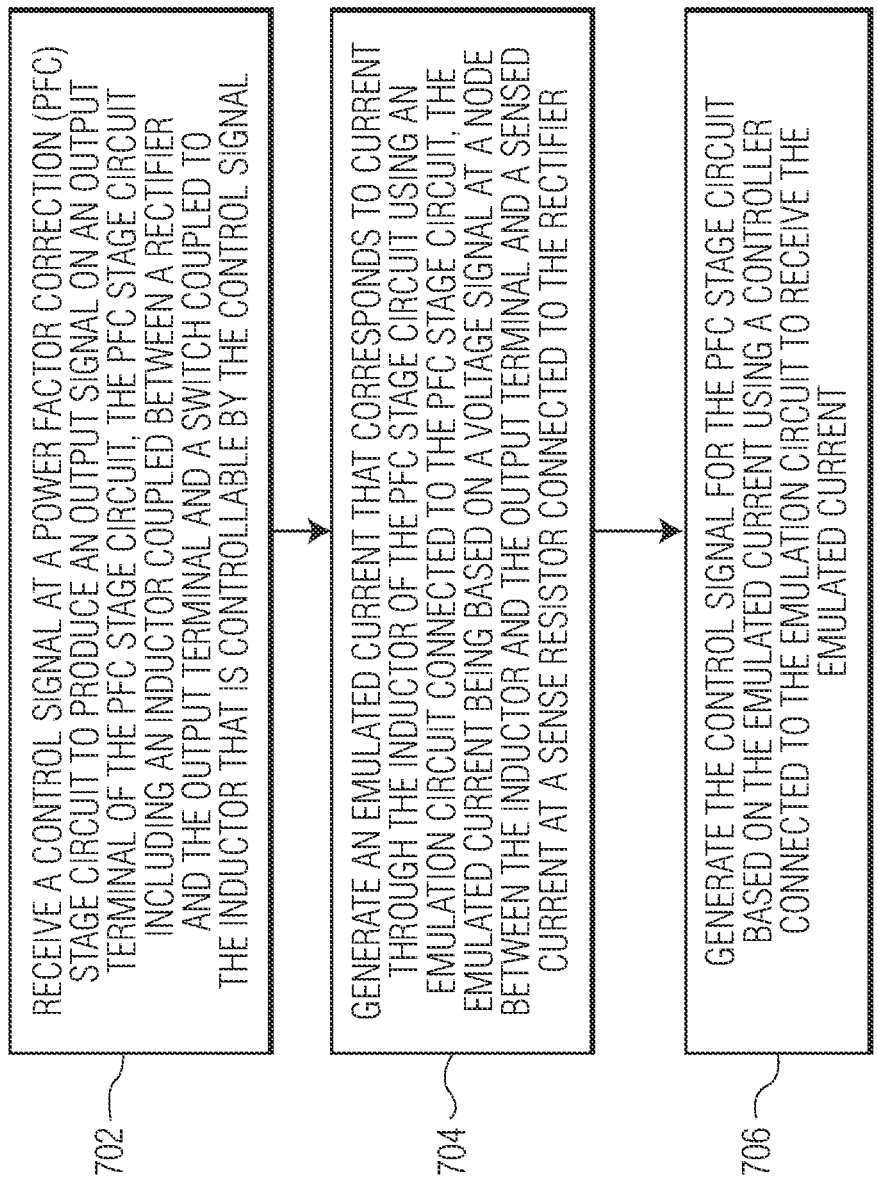
FIG. 7 is a flow diagram of a method of operating a power converter in accordance with an embodiment of the invention.

A method for operating a power converter in accordance with an embodiment of the invention is described with reference to a flow diagram of FIG. 7. At step 702, a control signal is received at a power factor correction (PFC) stage circuit to produce an output signal on an output terminal of the PFC stage circuit. The PFC stage circuit includes an inductor coupled between a rectifier and the output terminal and a switch coupled to the inductor that is controllable by the control signal. At step 704, an emulated current that corresponds to current through the inductor of the PFC stage circuit is generated using an emulation circuit connected to the PFC stage circuit. The emulated current is based on a voltage signal at a node between the inductor and the output terminal and a sensed current at a sense resistor connected to the rectifier. At step 706, the control signal for the PFC stage circuit is generated based on the emulated current using a controller connected to the emulation circuit to receive the emulated current.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A power converter comprising:
   a power factor correction (PFC) stage circuit configured to produce an output signal on an output terminal,
   the PFC stage circuit including an inductor coupled between a rectifier and the output terminal and a switch coupled to the inductor;
   an emulation circuit connected to the PFC stage circuit to generate an emulated current that corresponds to current through the inductor of the PFC stage circuit,
   the emulated current being generated based on a voltage signal at a node between the inductor and the output terminal and a sensed current at a sense resistor connected to the rectifier; and
   a controller connected to the emulation circuit to receive the emulated current and generate a control signal for the switch of the PFC stage circuit based on the emulated current;
   wherein the emulation circuit includes a voltage-to-current error amplifier to compare a first signal based on the voltage signal from the PFC stage and a second signal based on the emulated current and the sensed current;
   wherein the emulation circuit further includes an error amplifier to compare the emulated current and a signal based on the sensed current and a regulator to receive an output from the error amplifier to provide the second signal to the voltage-to-current error amplifier; and
   wherein the emulation circuit includes a feedforward compensating circuit to generate a signal related to an input signal using the voltage signal from the PFC stage circuit, the input signal being a signal at the inductor of the PFC stage circuit.

2. The power converter of claim 1:
wherein the emulation circuit further includes an integrator coupled to the voltage-to-current error amplifier to integrate an output from the voltage-to-current error amplifier to generate the emulated current.

3. The power converter of claim 1,
wherein the emulation circuit further includes a current amplifier to amplify the sensed current from the PFC stage circuit by a factor to produce an amplified signal that is applied to the error amplifier.

4. The power converter of claim 1,
wherein the emulation circuit further includes a divider to divide the voltage signal from the PFC stage circuit to produce a divided signal that is applied to the voltage-to-current error amplifier.

5. The power converter of claim 1:
wherein the feedforward compensating circuit includes a voltage divider to divide the voltage signal from the PFC stage circuit to produce a divided signal and a resistor and a capacitor that are connected in series to produce the signal related to the input signal using the divided signal.

6. The power converter of claim 5,
wherein the voltage divider of the feedforward compensating circuit is a capacitive voltage divider that includes a first capacitor and a second capacitor that are connected in series to receive the voltage signal from the PFC stage circuit and to produce the divided signal at a divide node between the first and second capacitors.

7. The power converter of claim 6,
further comprising a demagnetization detector that includes a comparator with a first input connected to the divide node to receive the divided signal and a second input connected to receive a reference voltage, the comparator having an output to generate a demagnetization detection signal that is used to detect an end of a secondary stroke for the PFC stage circuit.

8. A power converter comprising:
a power factor correction (PFC) stage circuit configured to produce an output signal on an output terminal, the PFC stage circuit including an inductor and a diode that are connected in series between a rectifier and the output terminal, the PFC stage circuit further including a transistor coupled between the inductor and electrical ground;
an emulation circuit connected to the PFC stage circuit to generate an emulated current that corresponds to current through the inductor of the PFC stage circuit, the emulated current being generated based on a voltage signal at a node between the inductor and the output terminal and a sensed current at a sense resistor connected to the rectifier and the electrical ground; and
a controller connected to the emulation circuit to receive the emulated current and generate a control signal for the transistor of the PFC stage circuit based on the emulated current;
wherein the emulation circuit includes a voltage-to-current error amplifier to compare a first signal based on the voltage signal from the PFC stage and a second signal based on the emulated current and the sensed current; and
wherein the emulation circuit further includes an error amplifier to compare the emulated current and a signal based on the sensed current and a regulator to receive an output from the error amplifier to provide the second signal to the voltage-to-current error amplifier.

9. The power converter of claim 8:
wherein the emulation circuit further includes an integrator coupled to the voltage-to-current error amplifier to integrate an output from the voltage-to-current error amplifier to generate the emulated current.

10. The power converter of claim 8:
wherein the emulation circuit includes a feedforward compensating circuit to generate a signal related to an input signal using the voltage signal from the PFC stage circuit,
the input signal being a signal at the inductor of the PFC stage circuit.

11. The power converter of claim 10,
wherein the feedforward compensating circuit includes a voltage divider to divide the voltage signal from the PFC stage circuit to produce a divided signal and a resistor and a capacitor that are connected in series to produce the signal related to the input signal using the divided signal.

12. The power converter of claim 11,
wherein the voltage divider of the feedforward compensating circuit is a capacitive voltage divider that includes a first capacitor and a second capacitor that are connected in series to receive the voltage signal from the PFC stage circuit and to produce the divided signal at a divide node between the first and second capacitors.

13. The power converter of claim 12,
further comprising a demagnetization detector that includes a comparator with a first input connected to the divide node to receive the divided signal and a second input connected to receive a reference voltage, the comparator having an output to generate a demagnetization detection signal that is used to detect an end of a secondary stroke for the PFC stage circuit.

14. The power converter of claim 1:
wherein the sense resistor is coupled between the rectifier and a ground; and
wherein the sensed current is an actual current flowing through the inductor.

15. The power converter of claim 8:
wherein the sense resistor is coupled between the rectifier and the electrical ground; and
wherein the sensed current is an actual current flowing through the inductor.

16. A power converter comprising:
a power factor correction (PFC) stage circuit configured to produce an output signal on an output terminal,
the PFC stage circuit including an inductor coupled between a rectifier and the output terminal and a switch coupled to the inductor;
an emulation circuit connected to the PFC stage circuit to generate an emulated current that corresponds to current through the inductor of the PFC stage circuit,
the emulated current being generated based on a voltage signal at a node between the inductor and the output terminal and a sensed current at a sense resistor connected to the rectifier; and
a controller connected to the emulation circuit to receive the emulated current and generate a control signal for the switch of the PFC stage circuit based on the emulated current;
wherein the emulation circuit includes a voltage-to-current error amplifier to compare a first signal based on the voltage signal from the PFC stage and a second signal based on the emulated current and the sensed current; and wherein the emulation circuit further includes an error amplifier to compare the emulated current and a signal based on the sensed current and a regulator to receive an output from the error amplifier to provide the second signal to the voltage-to-current error amplifier.

* * * * *